US012006427B2

(12) United States Patent
Lyu et al.

(10) Patent No.: US 12,006,427 B2
(45) Date of Patent: Jun. 11, 2024

(54) PHOSPHATE ENHANCED, HEAT RESISTANT ETHYLENE/ALPHA-OLEFIN INTERPOLYMER COMPOSITIONS

(71) Applicant: Dow Global Technologies LLC, Midland, MI (US)

(72) Inventors: Bo Lyu, Shanghai (CN); Yong Chen, Shanghai (CN); Rongjuan Cong, Lake Jackson, TX (US); Yabin Sun, Shanghai (CN); Tao Han, Shanghai (CN); Bharat I. Chaudhary, Princeton, NJ (US)

(73) Assignee: Dow Global Technologies LLC, Midland, MI (US)

( * ) Notice: Subject to any disclaimer, the term of this patent is extended or adjusted under 35 U.S.C. 154(b) by 810 days.

(21) Appl. No.: 17/049,492

(22) PCT Filed: Apr. 27, 2018

(86) PCT No.: PCT/CN2018/084775
§ 371 (c)(1),
(2) Date: Oct. 21, 2020

(87) PCT Pub. No.: WO2019/205081
PCT Pub. Date: Oct. 31, 2019

(65) Prior Publication Data
US 2021/0246291 A1    Aug. 12, 2021

(51) Int. Cl.
*C08L 23/16*    (2006.01)
*C08K 3/04*    (2006.01)
(Continued)

(52) U.S. Cl.
CPC .............. *C08L 23/16* (2013.01); *C08K 3/04* (2013.01); *C08K 3/22* (2013.01); *C08K 5/14* (2013.01);
(Continued)

(58) Field of Classification Search
CPC .. C08L 23/16; C08K 3/04; C08K 3/22; C08K 5/14; C08K 5/521
See application file for complete search history.

(56) References Cited

U.S. PATENT DOCUMENTS 3,974,132 A    8/1976    Valdiserri
4,769,179 A    9/1988    Kato et al.
(Continued)

FOREIGN PATENT DOCUMENTS

CN    102304254 A    1/2012
CN    103724820 A * 4/2014    .............. C08L 23/14
(Continued)

OTHER PUBLICATIONS

English machine translation of CN 103724820A. (Year: 2014).*
(Continued)

*Primary Examiner* — John E Uselding

(57) ABSTRACT

The present application relates to a composition comprising the following components: A) at least one ethylene/alpha-olefin interpolymer; B) a peroxide; C) at least one filler selected from one or more carbon black samples, MgO, or a combination thereof; and optionally, at least one filler selected from silica, ZnO, $CaCO_3$, Al $(OH)_3$, Mg $(OH)_2$, or a combination thereof; D) a calculated P content from 0.010 wt % to 0.300 wt %, based on the weight of the composition, and wherein the calculated P content is the calculated content the phosphorus element present in one or more phosphate compounds selected from Structure 1 below: O=P (OR1) (OR2) (OR3) (Structure 1), wherein R1, R2 and R3 are each, independently, selected from i) a non-aromatic hydrocarbon or ii) a non-aromatic hydrocarbon comprising at least one heteroatom, excluding P.

5 Claims, 1 Drawing Sheet

(51) Int. Cl.
  *C08K 3/22* (2006.01)
  *C08K 5/14* (2006.01)
  *C08K 5/521* (2006.01)
  *G01N 24/08* (2006.01)
  *G01R 33/46* (2006.01)
  *C08K 3/26* (2006.01)

(52) U.S. Cl.
  CPC .......... *C08K 5/521* (2013.01); *G01N 24/087* (2013.01); *G01R 33/4625* (2013.01); *C08K 2003/222* (2013.01); *C08K 2003/2224* (2013.01); *C08K 2003/2227* (2013.01); *C08K 2003/2296* (2013.01); *C08K 2003/265* (2013.01)

(56) References Cited

U.S. PATENT DOCUMENTS

| | | | |
|---|---|---|---|
| 4,910,241 | A | 3/1990 | Abolins et al. |
| 2002/0128391 | A1 | 9/2002 | Nakatsukasa et al. |
| 2018/0247729 | A1 | 8/2018 | Chaudhary |
| 2018/0247730 | A1 | 8/2018 | Chaudhary |

FOREIGN PATENT DOCUMENTS

| | | |
|---|---|---|
| CN | 104086902 A | 10/2014 |
| CN | 104194137 A | 12/2014 |
| CN | 104292662 A | 1/2015 |
| CN | 105837930 A | 8/2016 |
| CN | 106675041 A | 5/2017 |
| CN | 106751027 A | 5/2017 |
| JP | 848016047 B1 | 5/1973 |
| WO | 1986/002088 A1 | 4/1986 |
| WO | 2018/160402 A1 | 9/2018 |
| WO | 2018/160403 A1 | 9/2018 |

OTHER PUBLICATIONS

PCT/CN2018/084775, International Search Report and Written Opinion with a mailing date of Jan. 22, 2019.
Office Action from corresponding Chinese Application: 201880094002.8 dated Apr. 8, 2023.

* cited by examiner

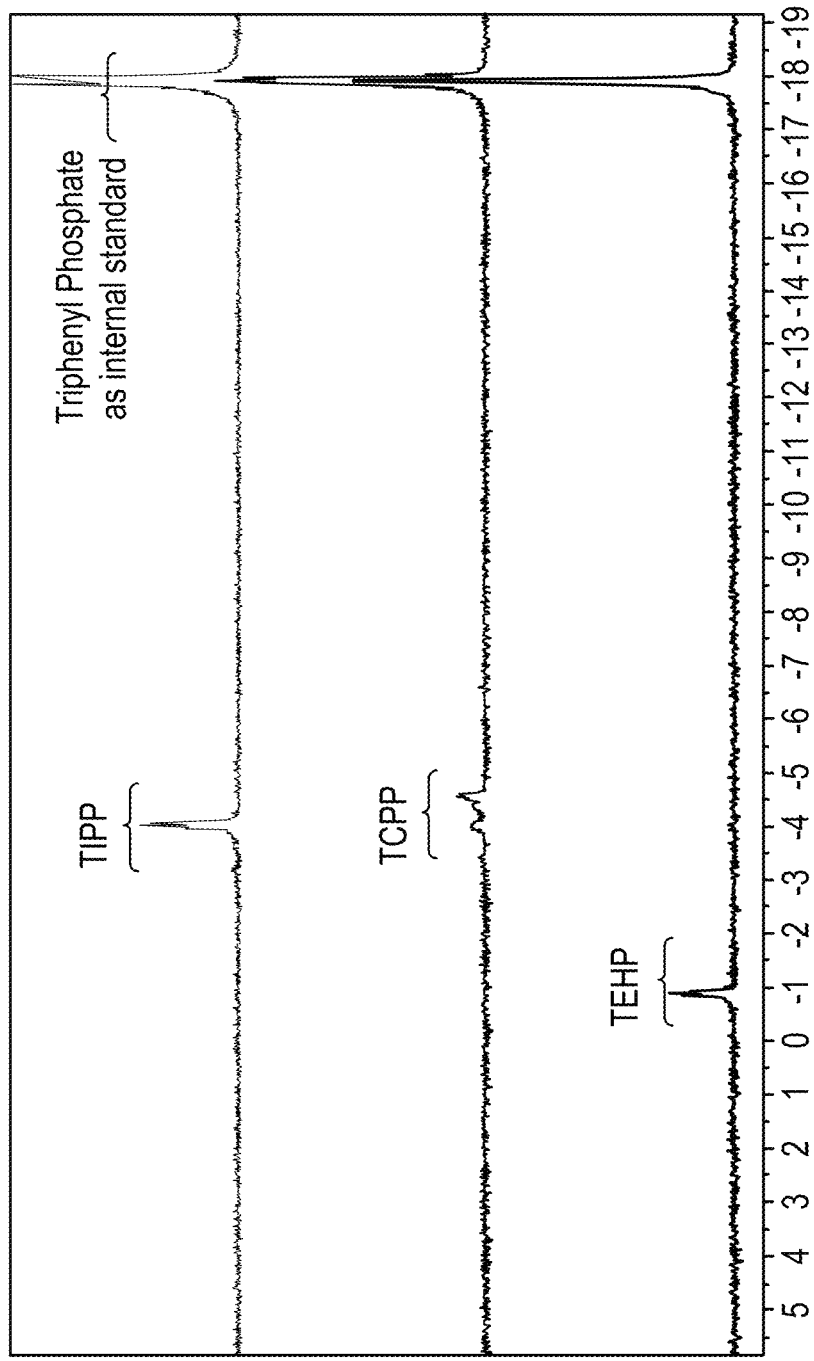

PHOSPHATE ENHANCED, HEAT RESISTANT ETHYLENE/ALPHA-OLEFIN INTERPOLYMER COMPOSITIONS

BACKGROUND OF THE INVENTION

Automotive Under-The-Hood (UTH) is one of the major applications for EPDM materials. The requirement on heat resistance and longevity for materials in UTH applications is becoming more stringent, as the materials are exposed to higher temperatures, due to more compact engine compartment design. According to automotive hose requirements from manufactures like Chrysler, Volkswagen, G M, and Ford, long term hot air aging performance, including elongation at break (EB), tensile strength (TS), EB retention, TS retention, and hardness, is critical to a final hose quality. Thus, there is a need for crosslinked EPDM compositions with good mechanical properties and good heat resistance.

Crosslinked EPDM compositions are described in the following references: U.S. Pat. No. 3,974,132, JP48016047B1 (Abstract), CN105837930A (Abstract), CN104292662A (Abstract), CN104194137A (Abstract), International Application Nos: PCT/US18/018903 (filed Feb. 21, 2018) and PCT/US18/018911 (filed Feb. 21, 2018), U.S. application Ser. No. 15/901,150 (filed Feb. 21, 2018) and Ser. No. 15/901,178 (filed Feb. 21, 2018).

However, as discussed above, there is a need for new ethylene/alpha-olefin interpolymer (for example, EPDM) compositions have improved mechanical properties and heat resistance. This need has been met by the following invention.

SUMMARY OF THE INVENTION

1. A composition comprising the following components:
A) at least one ethylene/alpha-olefin interpolymer;
B) a peroxide;
C) at least one filler selected from one or more carbon black samples, MgO, or a combination thereof; and optionally, at least one filler selected from silica, ZnO, $CaCO_3$, $Al(OH)_3$, $Mg(OH)_2$, or a combination thereof;
D) a calculated P content from 0.010 wt % to 0.300 wt %, based on the weight of the composition, and wherein the calculated P content is the calculated content the phosphorus element present in one or more phosphate compounds selected from Structure 1 below:

O=P(OR1)(OR2)(OR3)                                (Structure 1), wherein R1, R2 and R3 are each, independently, selected from i) a non-aromatic hydrocarbon or ii) a non-aromatic hydrocarbon comprising at least one heteroatom, excluding P.

BRIEF DESCRIPTION OF THE DRAWINGS

FIG. 1 is an overlay of $^{31}P$ NMR spectra of TIPP, TCPP and TEHP.

DETAILED DESCRIPTION

New ethylene/alpha-olefin interpolymer compositions have been discovered that have excellent curing properties, good mechanical properties, and good heat resistance upon aging. It has been discovered that low levels of certain phosphates, such as triisopropyl phosphate (TiPP, structure (i)) and tris(1-chloropropan-2-yl) phosphate (TCPP, structure (ii)), improve the crosslinking properties, and provide good mechanical properties and heat resistance of crosslinked compositions, formed from compositions containing a significant amount (i.e., 40 wt % or more) of an ethylene/alpha-olefin interpolymer, a peroxide, and at least one filler. Such compositions provide significant crosslinking density (i.e., 50 wt % or more), high Tensile Strength at Break (i.e., ≥10 MPa), and high Elongation at Break (i.e., ≥300%). Even after hot air aging at 180° C., these new compositions maintain good mechanical properties.

As discussed above, a composition is provided that comprises the following components:
A) at least one ethylene/alpha-olefin interpolymer;
B) a peroxide;
C) at least one filler selected from one or more carbon black samples, MgO, or a combination thereof; and optionally, at least one filler selected from silica, ZnO, $CaCO_3$, $Al(OH)_3$, $Mg(OH)_2$, or a combination thereof;
D) a calculated P content from 0.010 wt % to 0.300 wt %, based on the weight of the composition, and wherein the calculated P content is the calculated content the phosphorus element present in one or more phosphate compounds selected from Structure 1 below:

O=P(OR1)(OR2)(OR3)                                (Structure 1), wherein R1, R2 and R3 are each, independently, selected from i) a non-aromatic hydrocarbon or ii) a non-aromatic hydrocarbon comprising at least one heteroatom, excluding P.

For each Structure 1, the Calculated P content (wt %)= [(MW of P)/(MW phosphate compound)]×[(weight phosphate compound)/(weight of composition)]×100%.

The composition may comprise a combination of two or more embodiments described herein.

A composition component may comprise a combination of two or more embodiments described herein.

In one embodiment, or a combination of embodiments described herein, the calculated P content of component D is ≥0.010 wt %, or ≥0.015 wt %, or ≥0.020 wt %, or ≥0.025 wt %, or ≥0.030 wt %, based on the weight of the composition. In one embodiment, or a combination of embodiments described herein, the calculated P content of component D is ≤0.300 wt %, or ≤0.280 wt %, or ≤0.260 wt %, or ≤0.240 wt %, or ≤0.220 wt %, based on the weight of the composition.

In one embodiment, or a combination of embodiments described herein, the calculated P content of component D is ≥0.035 wt %, or ≥0.040 wt %, or ≥0.045 wt %, or ≥0.050 wt %, or ≥0.055 wt %, or ≥0.060 wt %, based on the weight of the composition. In one embodiment, or a combination of embodiments described herein, the calculated P content of component D is ≤0.200 wt %, or ≤0.190 wt %, or ≤0.180 wt %, or ≤0.170 wt %, or ≤0.160 wt %, or ≤0.150 wt, based on the weight of the composition.

In one embodiment, or a combination of embodiments described herein, the composition has a calculated Phosphorus content from 0.015 to 0.280 wt %, or from 0.020 to 0.260 wt %, or from 0.025 to 0.240 wt %, or from 0.030 to 0.220 wt %, or from 0.035 to 0.200 wt %, based on the weight of the composition.

In one embodiment, or a combination of embodiments described herein, the composition has a calculated Phosphorus content from 0.040 to 0.210 wt %, or from 0.045 to 0.205 wt %, or from 0.050 to 0.200 wt %, or from 0.055 to 0.195 wt %, or from 0.060 to 0.190 wt %, based on the weight of the composition.

In one embodiment, or a combination of embodiments described herein, the one or more phosphate compounds of Structure 1, is/are present in an amount is ≥0.50 wt %, or ≥0.55 wt %, or ≥0.60 wt %, or ≥0.65 wt %, or ≥0.70 wt %, or ≥0.75 wt %, based on the weight of the composition.

In one embodiment, or a combination of embodiments described herein, the one or more phosphate compounds of Structure 1, is/are present in an amount is ≤2.20 wt %, or ≤2.10 wt %, or ≤2.00 wt %, or ≤1.90 wt %, or ≤1.80 wt %, or ≤1.70 wt %, based on the weight of the composition.

In one embodiment, or a combination of embodiments described herein, for Structure 1, R1, R2 and R3 each, independently, do not contain a double bond [for example, C=C, C=O].

In one embodiment, or a combination of embodiments described herein, Structure 1 is selected from the following structures i through xiv:

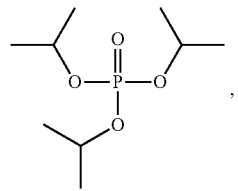
(i)

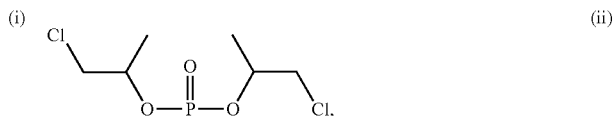
(ii)

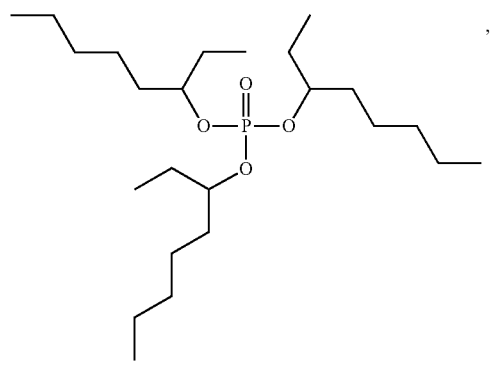
(iii)

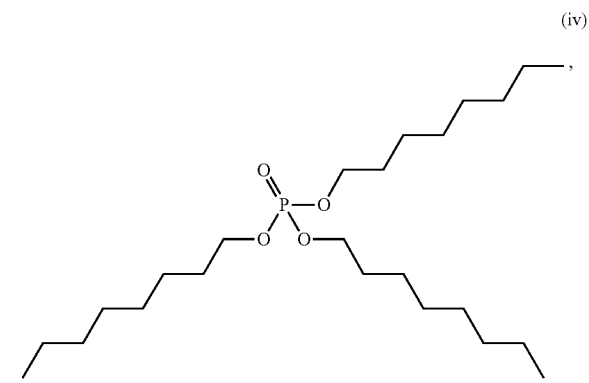
(iv)

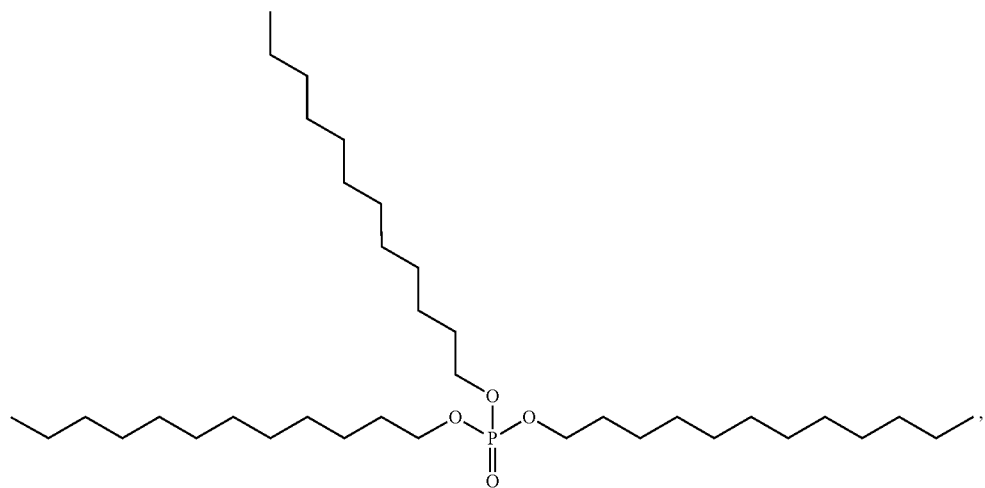
(v)

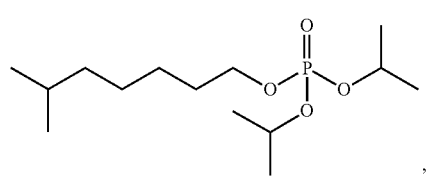
(vi)

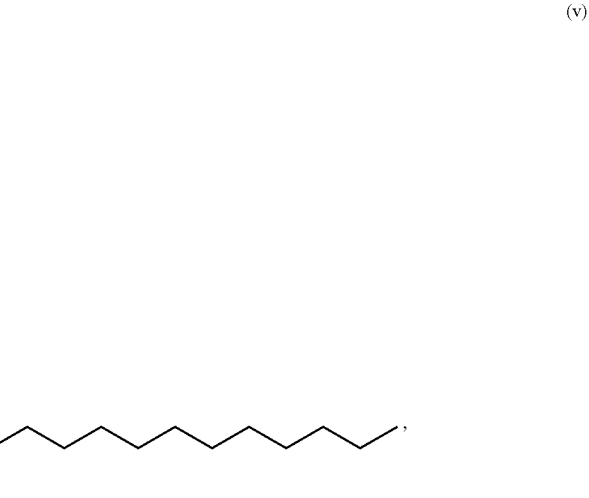

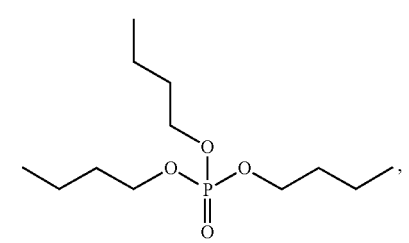
(vii)

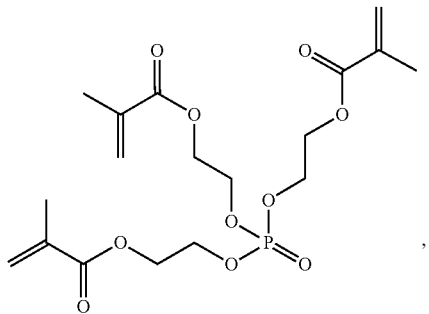
(viii)

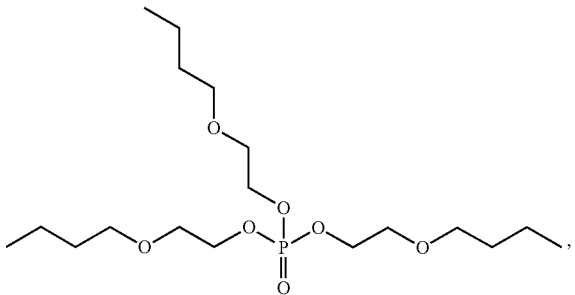
(ix)

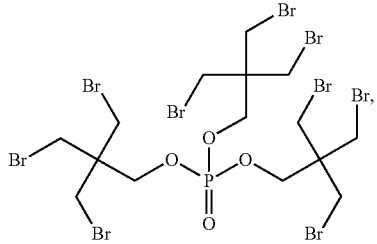
(x)

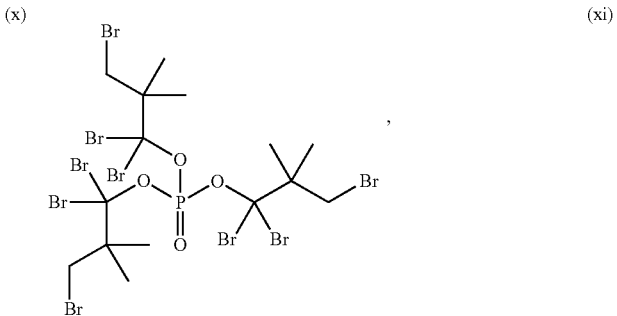
(xi)

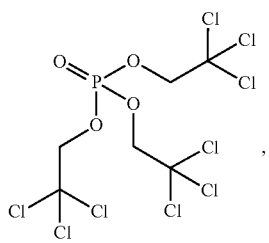
(xii)

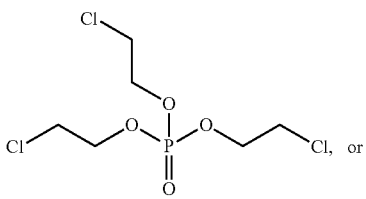
(xiii)

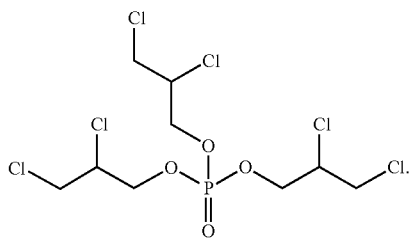
(xiv)

In one embodiment, or a combination of embodiments described herein, the ethylene/alpha-olefin interpolymer of component A is selected from an ethylene/α-olefin/diene terpolymer (for example, an EPDM) or an ethylene/α-olefin copolymer. Suitable α-olefins include the C3-C20 α-olefins, further the C3-C10 α-olefin, and further 1-octene, 1-hexene, 1-butene, and propylene. In a further embodiment, the ethylene/α-olefin interpolymer is an ethylene/α-olefin/diene terpolymer (for example, an EPDM).

In one embodiment, or a combination of embodiments described herein, component A comprises a second ethylene/alpha-olefin interpolymer, present in an amount less than the ethylene/alpha-olefin interpolymer, and that differs in density and/or Mooney Viscosity (ML 1+4, 125C) from the ethylene/alpha-olefin interpolymer. In a further embodiment, the weight ratio of the ethylene/alpha-olefin interpolymer to the second ethylene/alpha-olefin interpolymer is from 1.10 to 3.00, or from 1.20 to 2.80, or from 1.40 to 2.60, or from 1.60 to 2.40. Suitable α-olefins include the C3-C20 α-olefins, further the C3-C10 α-olefin, and further 1-octene, 1-hexene, 1-butene, and propylene. In a further embodiment, each polymer is an ethylene/α-olefin/diene interpolymer (for example, an EPDM) or an ethylene/α-olefin copolymer, and further an ethylene/α-olefin/diene interpolymer. Suitable α-olefins include the C3-C20 α-olefins, further the C3-C10 α-olefin, and further 1-octene, 1-hexene, 1-butene, and propylene. In a further embodiment, each polymer is an EPDM.

In one embodiment, or a combination of embodiments described herein, component A is present in an amount ≥35 wt %, or ≥36 wt %, or ≥37 wt %, or ≥38 wt %, or ≥39 wt %, or ≥40 wt %, or ≥41 wt %, or ≥42 wt %, based on the weight of the composition. In one embodiment, or a combination of embodiments described herein, component A is present in an amount ≤80 wt %, or ≤78 wt %, or ≤76 wt %, or ≤74 wt %, or ≤72 wt %, based on the weight of the composition.

In one embodiment, or a combination of embodiments described herein, component B is present in an amount ≥3.0 wt %, or ≥3.2 wt %, or ≥3.4 wt %, or ≥3.6 wt %, or ≥3.8 wt %, or ≥4.0 wt %, based on the weight of the composition. In one embodiment, or a combination of embodiments described herein, component B is present in an amount ≤10 wt %, or ≤9.0 wt %, or ≤8.5 wt %, or ≤8.0 wt %≤7.8 wt %, or ≤7.6 wt %, or ≤7.4 wt %, or ≤7.2 wt %, based on the weight of the composition.

In one embodiment, or a combination of embodiments described herein, component B is selected from the following: an aromatic dactyl peroxide; an aliphatic dactyl peroxide; a dibasic acid peroxide; a ketene peroxide; an alkyl peroxyester; an alkyl hydroperoxide [for example, diacetylperoxide; dibenzoylperoxide; bis-2,4-dichlorobenzoyl peroxide; di-tert-butyl peroxide; dicumylperoxode; tert-butyl-perbenzoate; tert-butylcumylperoxide; 2,5-bis(t-butylperoxy)-2,5-dimethylhexane; 2,5-bis(t-butylperoxy)-2,5-dimethylhexyne-3; 4,4,4',4'-tetra-(t-butylperoxy)-2,2-dicyclohexylpropane; 1,4-bis-(t-butylperoxyisopropyl)-benzene; 1,1-bis-(t-butylperoxy)-3,3,5-trimethyl-cyclohexane; lauroyl peroxide; succinic acid peroxide; cyclohexanone peroxide; t-butyl peracetate; butyl hydroperoxide]; or a combination thereof.

In one embodiment, or a combination of embodiments described herein, component B is selected from the following: diacetylperoxide; dibenzoylperoxide; bis-2,4-dichlorobenzoyl peroxide; di-tert-butyl peroxide; dicumylperoxode; tert-butyl-perbenzoate; tert-butylcumylperoxide; 2,5-bis (t-butylperoxy)-2,5-dimethylhexane; 2,5-bis (t-butylperoxy)-2,5-dimethyl-hexyne-3; 4,4,4',4'-tetra-(t-butylperoxy)-2,2-dicyclohexylpropane; 1,4-bis-(t-butylperoxyisopropyl)-benzene; 1,1-bis-(t-butylperoxy)-3,3,5-trimethyl-cyclohexane; lauroyl peroxide; succinic acid peroxide; cyclohexanone peroxide; t-butyl peracetate; butyl hydroperoxide; 1,3(4)-bis(tert-butylperoxyisopropyl)benzene, bis-peroxide; 2,5-Dimethyl 2,5-di(tert-butylperoxy) hexane; or a combination thereof.

In one embodiment, or a combination of embodiments described herein, component C is present in an amount ≥5.0 wt %, or ≥5.5 wt %, or ≥6.0 wt %, or 6.5 wt %, or ≥7.0 wt %, based on the weight of the composition. In one embodiment, or a combination of embodiments described herein, component D is present in an amount ≤42 wt %, or ≤40 wt %, or ≤38 wt %, or ≤36 wt %, or ≤34 wt %, based on the weight of the composition. In a further embodiment, component C comprises both carbon black and MgO. In a further embodiment, the weight ratio of carbon black to MgO is from 2.0 to 10, or from 3.0 to 9.0, or from 4.0 to 8.0, or from 5.0 to 7.0.

In one embodiment, or a combination of embodiments described herein, component C is present in an amount ≥7.0 wt %, or ≥8.0 wt %, or ≥9.0 wt %, or ≥10 wt %, or ≥12 wt %, or ≥14 wt %, or ≥16 wt %, or ≥18 wt %, or ≥20 wt %, or ≥22 wt % or ≥24 wt %, or ≥26 wt %, based on the weight of the composition. In one embodiment, or a combination of embodiments described herein, component D is present in an amount ≤42 wt %, or ≤40 wt %, or ≤38 wt %, or ≤36 wt %, or ≤34 wt %, based on the weight of the composition. In a further embodiment, component C comprises both carbon black and MgO. In a further embodiment, the weight ratio of carbon black to MgO is from 2.0 to 10, or from 3.0 to 9.0, or from 4.0 to 8.0, or from 5.0 to 7.0.

In one embodiment, or a combination of embodiments described herein, component C comprises both carbon black and MgO. In a further embodiment, the weight ratio of carbon black to MgO is from 2.0 to 10, or from 3.0 to 9.0, or from 4.0 to 8.0, or from 5.0 to 7.0.

In one embodiment, or a combination of embodiments described herein, component C comprises MgO. In a further embodiment, the weight ratio of MgO to component B is from 0.80 to 1.20, or from 0.85 to 1.15, or from 0.90 to 1.10, or from 0.95 to 1.05.

In one embodiment, or a combination of embodiments described herein, component C comprises only the following: at least one filler selected from one or more carbon black samples, MgO, or a combination thereof.

In one embodiment, or a combination of embodiments described herein, the weight ratio of component A to component C is from 1.20 to 5.00, or from 1.30 to 4.00, or from 1.40 to 3.50, or from 1.50 to 3.00, or from 1.60 to 2.50, or from 1.65 to 2.00.

In one embodiment, or a combination of embodiments described herein, the composition further comprises an oil. In a further embodiment, the oil is present in an amount ≥6.0 wt %, or ≥7.0 wt %, or ≥8.0 wt %, or ≥9.0 wt %, or ≥10 wt %, or ≥11 wt %, based on the weight of the composition. In one embodiment, or a combination of embodiments described herein, the oil is present in an amount ≤20 wt %, or ≤19 wt %, or ≤18 wt %, or ≤17 wt %, or ≤16 wt %, based on the weight of the composition.

In an embodiment, or a combination of embodiments described herein, the oil is selected from the group consisting of nonaromatic oils, paraffinic oils, naphthenic oils, and combinations thereof. Suitable oils include, but are not limited to, SUNPAR 2280, PARALUX 6001, HYDROBRITE 550, and CALSOL 5550.

In one embodiment, or a combination of embodiments describe herein, the composition comprises <0.10 wt %, or <0.05 wt %, or <0.01 wt % of an acid and/or ester-containing polymer, based on the weight of the composition. In a further embodiment, the composition does not comprise an acid and/or ester-containing polymer In one embodiment, or a combination of embodiments describe herein, the composition comprises <0.10 wt %, or <0.05 wt %, or <0.01 wt % of EVA, based on the weight of the composition. In a further embodiment, the composition does not comprise EVA.

In one embodiment, or a combination of embodiments describe herein, the composition comprises <0.10 wt %, or <0.05 wt %, or <0.01 wt % of a propylene-based copolymer (comprising a majority amount of polymerized propylene and a comonomer, as the only two monomer types), based on the weight of the composition. In a further embodiment, the composition does not comprise such propylene-based copolymer.

In one embodiment, or a combination of embodiments describe herein, the composition comprises <0.10 wt %, or <0.05 wt %, or <0.01 wt % of a polypropylene-homopolymer, based on the weight of the composition. In a further embodiment, the composition does not comprise a polypropylene homopolymer.

In one embodiment, or a combination of embodiments describe herein, the composition comprises <0.10 wt %, or <0.05 wt %, or <0.01 wt % of a polymer containing, in polymerized form, styrene, based on the weight of the composition. In a further embodiment, the composition does not comprise a polymer containing, in polymerized form, styrene.

In one embodiment, or a combination of embodiments describe herein, the composition comprises <0.10 wt %, or <0.05 wt %, or <0.01 wt % of a fluoro-containing polymer, based on the weight of the composition. In a further embodiment, the composition does not comprise a fluoro-containing polymer.

In one embodiment, or a combination of embodiments describe herein, the composition comprises <0.10 wt %, or <0.05 wt %, or <0.01 wt % of a polyurethane, based on the weight of the composition. In a further embodiment, the composition does not comprise a polyurethane.

Also provided is a crosslinked composition formed from the composition of one or a combination of two or more embodiments described herein.

In one embodiment, or a combination of embodiments described herein, the crosslinked composition has a measured P content from 0.010 wt % to 0.300 wt %, or from 0.015 to 0.280 wt %, or from 0.020 to 0.260 wt %, or from 0.025 to 0.240 wt %, or from 0.030 to 0.220 wt %, or from 0.035 to 0.200 wt %, based on the weight of the crosslinked composition, and wherein the measured P content is the measured content the phosphorus element present in one or more phosphate compounds selected from Structure 1, as determined by 31P NMR, as described herein.

In one embodiment, or a combination of embodiments described herein, the crosslinked composition has a measured P content from 0.010 wt % to 0.300 wt %, or from 0.020 to 0.250 wt %, or from 0.030 to 0.200 wt %, or from 0.040 to 0.150 wt %, or from 0.050 to 0.100 wt %, based on the weight of the crosslinked composition, and wherein the measured P content is the measured content the phosphorus element present in one or more phosphate compounds selected from Structure 1, as determined by 31P NMR, as described herein.

The term "crosslinking" refers to at least 50 wt %, further at least 60 wt %, further at least 70 wt %, further at least 80 wt % of the composition remains insoluble after refluxing in xylene, at a temperature of 110° C. (boiling point of xylene, reflux) for 12 hours. See ASTM D2765-01.

In one embodiment, or a combination of embodiments described herein, the crosslinked composition has a Tensile Strength at Break (no aging) from 8.0 to 16 MPa, or from 10 to 14 MPa.

In one embodiment, or a combination of embodiments described herein, the crosslinked composition has an Elongation at Break (no aging) from 250 to 600%, or from 300 to 550%.

The crosslinked composition may comprise a combination of two or more embodiments described herein.

Also provided is an article comprising at least one component formed from a composition of one or a combination of one or more embodiments described herein.

Also provided is an article comprising at least one component formed from a crosslinked composition of one or a combination of one or more embodiments described herein.

In one embodiment, or a combination of embodiments described herein, the article is selected from the group consisting of injection molded parts, gaskets, automotive parts, building and construction materials, footwear components, and tubes and hoses. In one embodiment, the article is an automotive part.

The article may comprise a combination of two or more embodiments described herein.

Also provided is a process to measure the Phosphorus content of a composition comprising at least one ethylene/alpha-olefin interpolymer and one or more phosphate compounds selected from Structure 1 below:

$$O=P(OR1)(OR2)(OR3) \quad \text{(Structure 1)},$$

wherein R1, R2 and R3 are each, independently, selected from a non-aromatic hydrocarbon or a non-aromatic hydrocarbon comprising at least one heteroatom, excluding P;

said process comprising the following steps:
A) preparing a solution triphenyl phosphate(TPP) in TCE-$d_2$;
B) swelling polymer specimen with the stock solution at a temperature, low enough such that the peroxide does not decompose, to obtain a swollen sample;
C) analyzing the swollen sample or solution using a NMR spectrometer, further a 400 Megahertz NMR spectrometer, to obtain a 31P NMR spectrum;
D) measuring 31P signal(s) [peak area] in a chemical shift range from 10.00 ppm to −12.00 ppm, with respect to TPP chemical shift from −16.50 ppm to −19.50 ppm, and a peak maximum at −17.91 ppm;
E) integrating the TPP peak area from −16.50 ppm to −19.50 ppm, and setting this area to 11000;
F) integrating the 31P signal(s) appearing in the range from 10.00 ppm to −12.00 ppm, further from 7.00 ppm to −12.00 ppm, further from 4.00 ppm to −10.00 ppm;
G) calculating the Phosphorus content using Equation A:

$$\text{Phosphorus content}=Y\times Z \quad \text{(Eqn. A), where}$$

$$Y = \frac{\text{Intergrated peak area(s) from } 10.00 \ ppm \text{ to } -12.00 \ ppm}{11000}, \text{ and}$$

$$Z = \frac{(\text{wt of } TPP \text{ stock solution, g}) \times (\text{wt fraction of } TPP \text{ stock solution}) \times 31 \times 100}{(\text{wt of polymer specimen, g}) \times 326.28},$$

where the weight fraction of TPP stock solution (wt fraction of TPP stock solution) is the ratio weight of TPP (g) divided by the total weight of TCE-d$_2$ (g) and TPP (g).

Also provided is a process to measure the Phosphorus content of a crosslinked composition formed from a composition comprising at least one ethylene/alpha-olefin interpolymer and one or more phosphate compounds selected from Structure 1 below:

O=P(OR1)(OR2)(OR3)     (Structure 1), wherein R1, R2 and R3 are each, independently, selected from a non-aromatic hydrocarbon or a non-aromatic hydrocarbon comprising at least one heteroatom, excluding P;

said process comprising the following steps:

A) preparing a solution triphenyl phosphate(TPP) in TCE-d$_2$;

B) swelling polymer specimen with the stock solution at a temperature, low enough such that the peroxide does not decompose, to obtain a swollen sample;

C) analyzing the swollen sample or solution using a NMR spectrometer, further a 400 Megahertz spectrometer, to obtain a 31P NMR spectrum;

D) measuring 31P signal(s) [peak area] in a chemical shift range from 10.00 ppm to −12.00 ppm, with respect to TPP chemical shift from −16.50 ppm to −19.50 ppm, and a peak maximum at −17.91 ppm;

E) integrating the TPP peak area from −16.50 ppm to −19.50 ppm, and setting this area to 11000;

F) integrating the 31P signal(s) appearing in the range from 10.00 ppm to −12.00 ppm, further from 7.00 ppm to −12.00 ppm, further from 4.00 ppm to −10.00 ppm;

G) calculating the Phosphorus content using Equation A:

Phosphorus content = $Y \times Z$     (Eqn. A), where $$Y = \frac{\text{Intergrated peak area(s) from } 10.00\ ppm \text{ to} - 12.00\ ppm}{11000}, \text{ and}$$

$$Z = \frac{(\text{wt of } TPP \text{ stock solution, g}) \times (\text{wt fraction of } TPP \text{ stock solution}) \times 31 \times 100}{(\text{wt of polymer specimen, g}) \times 326.28},$$

where the weight fraction of TPP stock solution (wt fraction of TPP stock solution) is the ratio weight of TPP (g) divided by the total weight of TCE-d$_2$ (g) and TPP (g).

The following embodiments apply to both above processes to measure P content.

In one embodiment, or a combination of embodiments described herein, for step B, the polymer is swelled at a temperature from 60° C. to 90° C., or from 62° C. to 88° C., or from 65° C. to 85° C., or from 67° C. to 82° C., from 70° C. to 80° C., from 72° C. to 78° C., from 74° C. to 76° C.

In one embodiment, or a combination of embodiments described herein, for Structure 1, R1, R2 and R3 each, independently, do not contain a double bond [for example, C=C, C=O].

In one embodiment, or a combination of embodiments described herein, Structure 1 is selected from the following structures i through xiv:

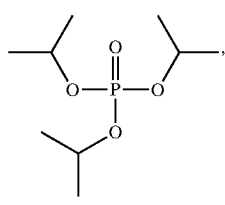

(i)

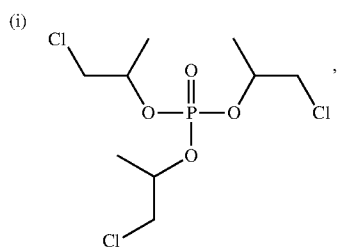

(ii)

-continued
(iii)
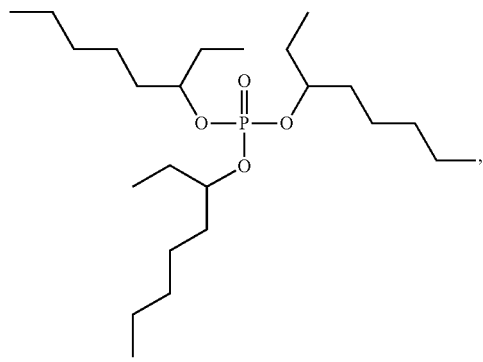
(iv)
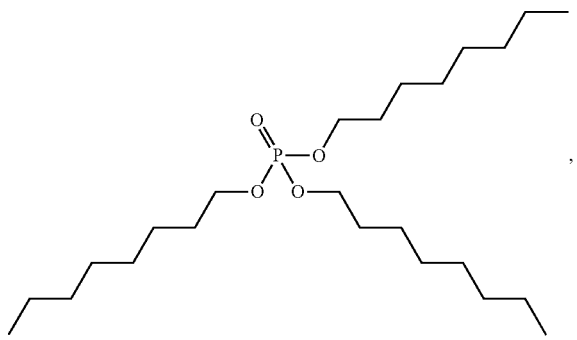
(v)
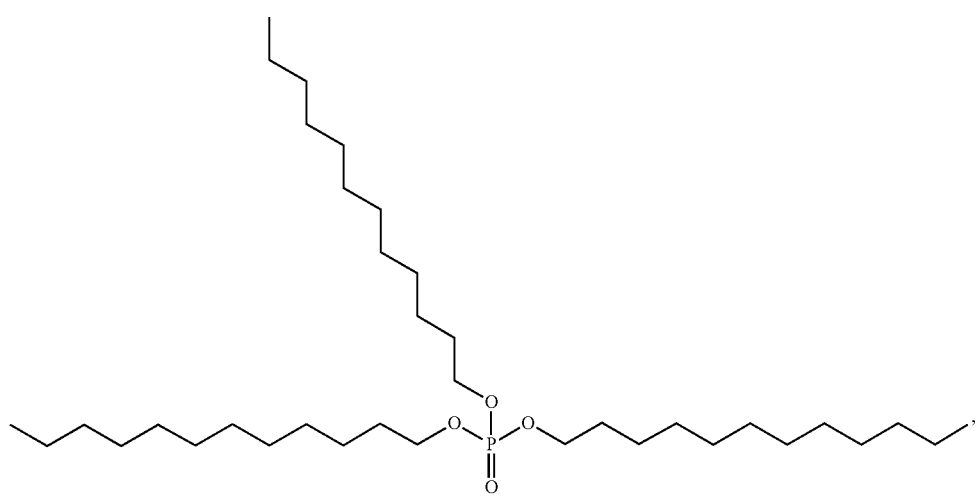
(vi)
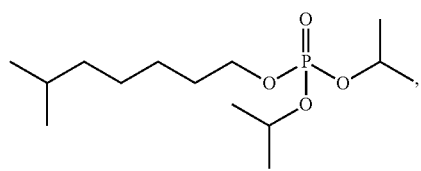
(vii)
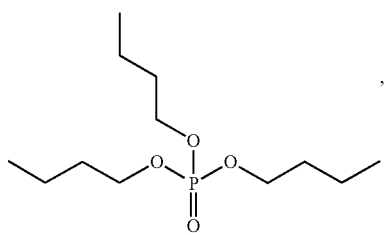
(viii)
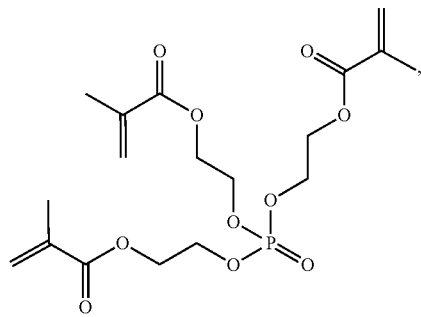
(ix)
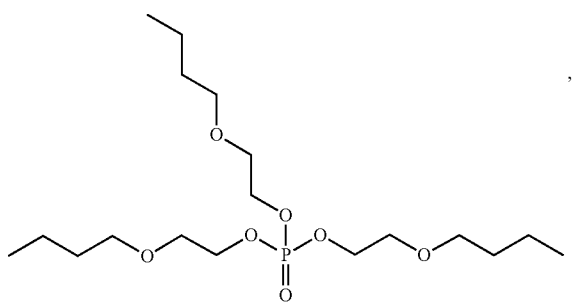

-continued

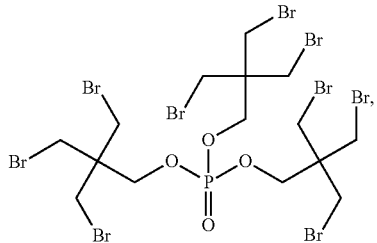

(x)

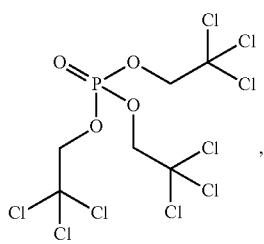

(xii)

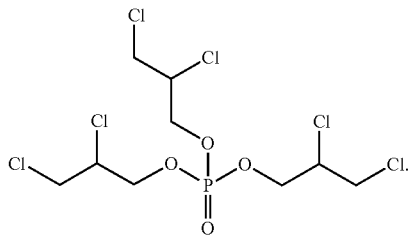

(xiv)

(xi)

(xiii)

In one embodiment, or a combination of embodiments described herein, the ethylene/alpha-olefin interpolymer of component A is selected from an ethylene/α-olefin/diene interpolymer (for example, an EPDM) or an ethylene/α-olefin copolymer. Suitable α-olefins include the C3-C20 α-olefins, further the C3-C10 α-olefin, and further 1-octene, 1-hexene, 1-butene, and propylene. In a further embodiment, the ethylene/alpha-olefin interpolymer of component A is an ethylene/α-olefin/diene interpolymer (for example, an EPDM).

Component A

In one embodiment, or a combination of embodiments described herein, the ethylene/alpha-olefin interpolymer of component A is an ethylene/alpha-olefin/diene interpolymer.

The alpha-olefin may be either an aliphatic or an aromatic compound. In an embodiment, the alpha-olefin is preferably a $C_3$-$C_{20}$ alpha-olefin, or a $C_3$-$C_{16}$ alpha-olefin, or a $C_3$-$C_{10}$ alpha-olefin. Exemplary $C_3$-$C_{10}$ alpha-olefins are propylene, 1-butene, 1-hexene and 1-octene. In an embodiment, the alpha-olefin is propylene.

In an embodiment, or a combination of embodiments described herein, the ethylene/alpha-olefin interpolymer has a weight average molecular weight $(M_w)$≥70,000, or ≥80,000, or ≥90,000, or ≥100,000, ≥120,000, or ≥150,000, or ≥160,000, or ≥170,000, or ≥180,000, or ≥190,000, or ≥200,000 or ≥210,000, or ≥220,000, or ≥230,000 g/mol. In an embodiment, or a combination of embodiments described herein, the ethylene/alpha-olefin interpolymer has a weight average molecular weight $(M_w)$≤600,000, or ≤500,000, or ≤400,000, or ≤350,000, or ≤300,000, g/mol.

In one embodiment, or a combination of embodiments described herein, the ethylene/alpha-olefin interpolymer of component has a molecular weight distribution (Mw(conv)/Mn(conv))≥2.10, or ≥2.50, or ≥3.50, or ≥4.00, or ≥4.20, or ≥4.40, or ≥4.50.

In one embodiment, or a combination of embodiments described herein, the least one ethylene/alpha-olefin interpolymer has a molecular weight distribution (Mw(conv)/Mn(conv))≤6.50, or ≤6.20≤6.10, or ≤6.00.

In one embodiment, or a combination of embodiments described herein, the ethylene/alpha-olefin interpolymer has a Mooney viscosity (ML(1+4) at 125° C.)≤10, or ≤15, or ≥20, or ≥25, or ≥30, or ≥35. In one embodiment, or a combination of embodiments described herein, the ethylene/alpha-olefin interpolymer has a Mooney viscosity (ML(1+4) at 125° C.)≤100, or ≤95, or ≤85, or ≤80. Mooney viscosity is that of the interpolymer without a filler and without oil unless otherwise noted.

In one embodiment, or a combination of embodiments described herein, the ethylene/alpha-olefin interpolymer has a density of ≤0.890, or ≤0.885, or ≤0.880, or ≤0.875 g/cc. In one embodiment, or a combination of embodiments described herein, the ethylene/alpha-olefin interpolymer has a density of ≥0.850 g/cc, or ≥0.855 g/cc, or ≥0.860 g/cc (1 cc=1 cm$^3$).

The ethylene/alpha-olefin interpolymer (component A) may comprise a combination of two or more embodiments described herein.

In one embodiment, or a combination of embodiments described herein, the ethylene/alpha-olefin interpolymer (component A) is an ethylene/alpha-olefin/diene interpolymer (EAODM), and further an EPDM.

The alpha-olefin may be either an aliphatic or an aromatic compound. In an embodiment, the alpha-olefin is preferably a $C_3$-$C_{20}$ aliphatic compound, or a $C_3$-$C_{16}$ aliphatic compound, or a $C_3$-$C_{10}$ aliphatic compound. Exemplary $C_3$-$C_{10}$ aliphatic alpha-olefins are propylene, 1-butene, 1-hexene and 1-octene. In an embodiment, the alpha-olefin is propylene.

Illustrative dienes include straight chain acyclic dienes, such as 1,4-hexadiene and 1,5-heptadiene; branched chain acyclic dienes, such as 5-methyl-1,4-hexadiene, 2-methyl-1,5-hexadiene, 6-methyl-1,5-heptadiene, 7-methyl-1,6-octadiene, 3,7-dimethyl-1,6-octadiene, 3,7-dimethyl-1,7-octadiene, 5,7-dimethyl-1,7-octadiene, 1,9-decadiene, and mixed isomers of dihydromyrcene; single ring alicyclic dienes such as 1,4-cyclohexadiene, 1,5-cyclooctadiene and 1,5-cyclododecadiene; multi-ring alicyclic fused and bridged ring dienes, such as tetrahydroindene, methyl tetrahydroindene; alkenyl, alkylidene, cycloalkenyl and cycloalkylidene norbornenes such as 5-methylene-2-norbornene (MNB), 5-ethylidene-2-norbornene (ENB), 5-vinyl-2-norbornene, 5-propenyl-2-norbornene, 5-isopropylidene-2-norbornene, 5-(4-cyclopentenyl)-2-norbornene, and 5-cyclohexylidene-2-norbornene. In an embodiment, the diene is selected from ENB, dicyclopentadiene, 1,4-hexadiene, 7-methyl-1,6-octadiene, and preferably, ENB, dicyclopentadiene and 1,4-hexadiene. In an embodiment, the diene is selected from ENB and dicyclopentadiene. In an embodiment, the diene is ENB.

In an embodiment, or a combination of embodiments described herein, the EAODM comprises from 50 wt %, or 60 wt %, or 65 wt %, or 70 wt %, or 75 wt % to 80 wt %, or 85 wt %, or 90 wt %, or 95 wt % ethylene, based on the total weight of the EAODM. In a further embodiment, the ethylene/α-olefin/diene interpolymer is an EPDM. In a further embodiment, the diene is ENB.

In one embodiment, or a combination of embodiments described herein, the ethylene/alpha-olefin/diene interpolymer has a Mooney viscosity (ML(1+4) at 125° C.)≥10, or ≥15, or ≥20, or ≥25, or ≥30, or ≥35. In one embodiment, or a combination of embodiments described herein, the ethylene/alpha-olefin/diene interpolymer has a Mooney viscosity (ML(1+4) at 125° C.)≤100, or ≤95, or ≤90, or ≤85, or ≤80. In a further embodiment, the ethylene/α-olefin/diene interpolymer is an EPDM. In a further embodiment, the diene is ENB. Mooney viscosity is that of the copolymer without a filler and without oil unless otherwise noted.

In one embodiment, or a combination of embodiments described herein, the ethylene/alpha-olefin/diene interpolymer has a density of ≤0.890, or ≤0.885, or ≤0.880, or ≤0.875 g/cc. In one embodiment, or a combination of embodiments described herein, the ethylene/alpha-olefin/diene interpolymer has a density of ≥0.850 g/cc, or ≥0.855 g/cc, or ≥0.860 g/cc (1 cc=1 cm$^3$). In a further embodiment, the ethylene/α-olefin/diene interpolymer is an EPDM. In a further embodiment, the diene is ENB.

In one embodiment, or a combination of embodiments described herein, the ethylene/alpha-olefin/diene interpolymer has a "% Peak Area (from 21.2 to 22.0 ppm)"≥3.0, or ≥5.0, or ≥7.0, or ≥10, or ≥12, or ≥14, or ≥16, or ≥18, or ≥20, as determined by 13C NMR (propylene tacticity marker). In a further embodiment, the ethylene/α-olefin/diene interpolymer is an EPDM. In a further embodiment, the diene is ENB. In one embodiment, or a combination of embodiments described herein, the ethylene/alpha-olefin/diene interpolymer has a "% Peak Area (from 21.2 to 22.0 ppm)"≤40%, or ≤35%, or ≤30%, as determined by 13C NMR (propylene tacticity marker), as described herein. In a further embodiment, the ethylene/α-olefin/diene interpolymer is an EPDM. In a further embodiment, the diene is ENB.

In one embodiment, or a combination of embodiments described herein, the ethylene/α-olefin/diene interpolymer comprises from 0.5 wt %, or 1.0 wt %, or 1.5 wt %, or 2.0 wt %, or 2.5 wt %, or 3.0 wt %, or 3.5 wt %, or 4.0 wt %, or 4.5 wt %, or 5.0 wt % to 5.5 wt %, or 6.0 wt %, or 6.5 wt %, or 7.0 wt %, or 7.5 wt %, or 8.0 wt % diene, based on the total weight of the ethylene/α-olefin/diene interpolymer. In a further embodiment, the ethylene/α-olefin/diene interpolymer is an EPDM. In a further embodiment, the diene is ENB.

In one embodiment, or a combination of embodiments described herein, the ethylene/α-olefin/diene interpolymer has a molecular weight distribution (MWD, or Mw/Mn) ≥1.2, or ≥1.5, or ≥1.7, or ≥1.8, or ≥2.0, or ≥2.2 to ≤2.5, or ≤3.0, or ≤3.5 to ≤4.0, or ≤4.5, or ≤5.0. In a further embodiment, the ethylene/α-olefin/diene interpolymer is an EPDM. In a further embodiment, the diene is ENB.

In one embodiment, the ethylene/α-olefin/diene interpolymer has a weight average molecular weight (Mw) from 80,000 g/mol, or 100,000 g/mol to 200,000 g/mol, or 300,000 g/mol, or 400,000 g/mol. In a further embodiment, the ethylene/α-olefin/diene interpolymer is an EPDM. In a further embodiment, the diene is ENB.

In an embodiment, the ethylene/alpha-olefin/diene interpolymer is an ethylene/propylene/diene interpolymer (EDPM). In a further embodiment, the diene is ENB.

The ethylene/α-olefin/diene interpolymer, further an EPDM, may comprise a combination of two or more embodiments as described herein.

In one embodiment, or a combination of embodiments described herein, the ethylene/alpha-olefin interpolymer (component A) is an ethylene/alpha-olefin copolymer.

The ethylene/α-olefin copolymer comprises, in polymerized form, ethylene and an α-olefin. The α-olefin may be either an aliphatic or an aromatic compound. In an embodiment, the α-olefin is a $C_3$-$C_{20}$ α-olefin, preferably a $C_3$-$C_{16}$ α-olefin, and more preferably a $C_4$-$C_{10}$ α-olefin. Preferred $C_4$-$C_{10}$ alpha-olefins are selected from the group consisting of 1-butene, 1-hexene and 1-octene, and more preferably 1-octene.

In an embodiment, or a combination of embodiments described herein, the ethylene/alpha-olefin copolymer has a weight average molecular weight (Mw(conv))≥50,000, or ≥60,000, or ≥70,000, or ≥80,000, or ≥90,000, or ≥100,000 g/mol. In an embodiment, or a combination of embodiments described herein, the ethylene/alpha-olefin copolymer has a weight average molecular weight (Mw)≤300,000, or ≤250,000, or ≤200,000, or ≤150,000 g/mol.

In an embodiment, or a combination of embodiments described herein, the ethylene/alpha-olefin copolymer has a melt index (I2)≥0.2, or ≥0.5, or ≥1.0, or ≥5.0, or ≥10, or ≥15, or ≥20, or ≥25 g/10 min. In an embodiment, or a combination of embodiments described herein, the ethylene/alpha-olefin copolymer has a melt index (I2)≤200, or ≤150, or ≤100, or ≤50 g/10 min.

In one embodiment, or a combination of embodiments described herein, the ethylene/alpha-olefin copolymer has a molecular weight distribution (Mw(conv)/Mn(conv))≥1.8, or ≥2.0, or ≥2.2, or ≥2.4, or ≥2.6, or ≥2.8, or ≥3.0. In an embodiment, or a combination of embodiments described herein, the least one ethylene/alpha-olefin copolymer has a molecular weight distribution (Mw(conv)/Mn(conv))≤5.0, or ≤4.5≤4.0, or ≤3.5.

In one embodiment, or a combination of embodiments described herein, the ethylene/alpha-olefin copolymer has a Mooney viscosity (ML(1+4) at 125° C.)≥10, or ≥15, or ≥20, or ≥25, or ≥30. In one embodiment, or a combination of embodiments described herein, the ethylene/alpha-olefin copolymer has a Mooney viscosity (ML(1+4) at 125° C.)≤80, or ≤70, or ≤60, or ≤55, or ≤50. Mooney viscosity is that of the copolymer without a filler and without oil unless otherwise noted.

In one embodiment, or a combination of embodiments described herein, the ethylene/alpha-olefin copolymer has a density of ≤0.890, or ≤0.880, or ≤0.875, or ≤0.870 g/cc. In one embodiment, or a combination of embodiments described herein, the ethylene/alpha-olefin copolymer has a density of ≥0.850 g/cc, or ≥0.855 g/cc, or ≥0.860 (1 cc=1 cm$^3$).

The ethylene/alpha-olefin copolymer of may comprise a combination of two or more embodiments described herein.

Additives

A composition may comprise one or more additives, such as oils, crosslinking (or vulcanizing) agents, fillers, antioxidants, flame retardants, foaming agents, colorants or pigments, and thermoplastic polymers, among others.

Additional additives include, but are not limited to, fillers, flame retardants, colorants or pigments, thermoplastic polymers, and combinations thereof. Such additives can be employed in a desired amount to achieve their desired effect.

In one embodiment, or a combination of embodiments described herein, the inventive composition further comprises at least one antioxidant. Illustrative antioxidants include, but are not limited to, hindered phenols, bisphenols, and thiobisphenols; and substituted hydro-quinones.

In an embodiment, the composition optionally includes one or more additives. Nonlimiting examples of additives include oils and/or stabilizers.

Definitions

Unless stated to the contrary, implicit from the context, or customary in the art, all parts and percents are based on weight, and all test methods are current as of the filing date of this disclosure.

The term "composition," as used herein, includes the material(s), which comprise the composition, as well as reaction products and decomposition products formed from the materials of the composition. Any reaction product or decomposition product is typically present in trace or residual amounts.

The term "polymer," as used herein, refers to a compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure) and the term interpolymer as defined hereinafter. Trace amounts of impurities, such as catalyst residues, can be incorporated into and/or within the polymer.

The term "interpolymer," as used herein, refers to polymers prepared by the polymerization of at least two different types of monomers. The term interpolymer thus includes the term copolymer (employed to refer to polymers prepared from two different types of monomers) and polymers prepared from more than two different types of monomers.

The term "ethylene/α-olefin interpolymer," as used herein, refers to a polymer that comprises, in polymerized form, ethylene, and an α-olefin. In one embodiment, the "ethylene/α-olefin interpolymer" comprises a majority weight percent of ethylene (based on the weight of the interpolymer).

The term "ethylene/α-olefin/diene interpolymer," as used herein, refers to a polymer that comprises, in polymerized form, ethylene, an α-olefin, and a diene. In one embodiment, the "ethylene/α-olefin/diene interpolymer" comprises a majority weight percent of ethylene (based on the weight of the interpolymer).

The term "ethylene/α-olefin/diene terpolymer," as used herein, refers to a polymer that comprises, in polymerized form, ethylene, an α-olefin, and a diene, as the only monomer types. In one embodiment, the "ethylene/α-olefin/diene interpolymer" comprises a majority weight percent of ethylene (based on the weight of the interpolymer).

The term, "ethylene/α-olefin copolymer," as used herein, refers to a copolymer that comprises, in polymerized form, 50 wt % or a majority amount of ethylene monomer (based on the weight of the copolymer), and an α-olefin, as the only two monomer types. In one embodiment, the ethylene/α-olefin copolymer comprises a majority amount of ethylene monomer (based on the weight of the ethylene-based copolymer) and an α-olefin as the only monomer types.

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed.

Test Methods

Melt Index

Melt index ($I_2$, or MI) of an ethylene-based polymer (majority wt % polymerized ethylene, based on the weight of the polymer) is measured in accordance with ASTM D-1238 at a temperature of 190° C. and a load of 2.16 kg. Melt Flow Rate (MFR) of a propylene-based polymer (majority wt % polymerized propylene, based on the weight of the polymer) is measured in accordance with ASTM D-1238 at a temperature of 230° C. and a load of 2.16 kg.

FTIR Method for EPDM Composition Analysis

The terpolymers containing ethylene, propylene, and 5-ethylidene-2-norbornene were analyzed using ASTM D3900 for their respective ethylene contents and ASTM D6047 for their ethylidene-norbornene or dicyclopentadiene contents.

Density

Density is determined in accordance with ASTM D792, Method B. The results are recorded in grams (g) per cubic centimeter (g/cc or g/cm$^2$).

Mooney Viscosity

Mooney Viscosity (ML1+4 at 125° C.) was measured in accordance with ASTM 1646, with a one minute preheat time and a four minute rotor operation time. The instrument is an Alpha Technologies Mooney Viscometer 2000.

The viscosity of each formulated composition is measured using an uncured blanket (see experimental section), so that the viscosity of the uncured composition could be examined. Samples were conditioned for 24 hours at room temperature, prior to testing.

GPC (Conventional)

Molecular weight is determined using gel permeation chromatography (GPC) on a Waters 150° C., or Polymer-Char high temperature chromatographic unit equipped with three 10 micron mixed B porosity columns (Polymer Laboratories 103, 104, 105, and 106), operating at a system temperature of 140° C. The solvent is 1,2,4-trichlorobenzene, from which 2 mg/mL solutions of the samples are prepared for injection. The flow rate is 1.0 mL/min and the injection size is 100 microliters. The 1,2,4-trichlorobenzene contained 200 parts per million butylated hydroxytoluene antioxidant.

The molecular weight determination is deduced by using narrow molecular weight distribution polystyrene standards (from Polymer Laboratories) in conjunction with their elution volumes. The calibration is performed using 21 narrow polystyrene (PS) standards with a third order fit along the elution volume. The equivalent polyethylene molecular weights are determined by using appropriate Mark-Houwink coefficients for polyethylene and polystyrene (as described by T. Williams & I. M. Ward, *The Construction of a Polyethylene Calibration Curve for Gel Permeation Chromatography Using Polystyrene Fractions*, 6 J. Polymer Sci. Pt. B: Polymer Letter 621, 621-624 (1968)) to derive the following equation:

$$M_{polyethylene} = a \times (M_{polystyrene})^b$$

In this equation, a=0.4316 and b=1.0.

Number average molecular weight, $M_n$, of a polymer is expressed as the first moment of a plot of the number of molecules in each molecular weight range against the molecular weight. In effect, this is the total molecular weight of all molecules divided by the number of molecules and is calculated in the usual matter according to the following formula:

$$M_n = \sum n_i \times M_i \Big/ \sum n_I = \sum w_i \Big/ \sum (w_i / M_i),$$

where
  $n_i$=number of molecules with molecular weight $M_i$
  $w_i$=weight fraction of material having molecular weight $M_i$
  and $\Sigma n_i$=total number of molecules.

Weight average molecular weight, $M_w$, is calculated in the usual manner according to the following formula: $M_w = \Sigma w_i \times M_i$, where $w_i$ and $M_i$ are the weight fraction and molecular weight, respectively, of the $i^{th}$ fraction eluting from the GPC column.

The ratio of these two averages, the molecular weight distribution (MWD or $M_w/M_n$), defines the breadth of the molecular weight distribution.

$^{13}$C NMR Method for EPDM Composition Analysis and Tacticity (% Mm)

The samples were prepared by adding approximately "2.6 g" of a "50/50 mixture of tetrachloroethane-d2/orthodichlorobenzene" containing "0.025M" in chromium acetylacetonate (relaxation agent) to "0.2 g sample" in a 10 mm NMR tube. The head space of NMR tube was purged with $N_2$ to remove air. The samples were dissolved, and homogenized, by heating the tube and its contents to 150° C. The data were collected using a Bruker 400 MHz spectrometer, equipped with a Bruker Dual DUL high-temp CryoProbe. The data was acquired using "160 scans per data file," a six second pulse repetition delay, with a sample temperature of 120° C. The acquisition was carried out using a spectral width of 25,000 Hz and a file size of 32K data points. NMR spectral analysis of each composition of the examples was carried out using the following analysis method. Quantitation of monomers present in EPDM can also be calculated using the following equations (1 through 9). The calculation of moles ethylene normalizes the spectral range from 55.0 to 5.0 ppm to 1000 integral units. The contribution under the normalized integral area only accounts for 7 of the ENB carbons.

$$molesEth = \frac{(1000 - 3*molesP - 7*molesENB)}{2};$$ Eqn. 1

$$molesENB = CH3(13.6\text{-}14.7 \text{ ppm});$$ Eqn. 2

$$molesP = CH3(19.5\text{-}22.0 \text{ ppm});$$ Eqn. 3

$$\text{mole \% ethylene} = \frac{100*molesE}{molesE + molesP + molesENB};$$ Eqn. 4

$$\text{mole \% propylene} = \frac{100*molesP}{molesE + molesP + molesENB};$$ Eqn. 5

$$\text{mole \% ENB} = \frac{100*molesENB}{molesE + molesP + molesENB};$$ Eqn. 6

Wt % ethylene = Eqn. 7
$$\frac{100*\text{mole \% } E*28}{\text{mole \% } E*28 + \text{mole \% } P*42 + \text{mole \% } ENB*120}$$

Wt % propylene = Eqn. 8
$$\frac{100*\text{mole \% } P*42}{\text{mole \% } E*28 + \text{mole \% } P*42 + \text{mole \% } ENB*120};$$

Wt % WNB = Eqn. 9
$$\frac{100*\text{mole \% } ENB*120}{\text{mole \% } E*28 + \text{mole \% } P*42 + \text{mole \% } ENB*120}$$

Propylene Tacticity % mm Area 13C NMR

13C NMR spectral analysis of the EPDMS to quantitate the level of tacticity % mm was performed in a "50/50 mixture of tetrachloroethane-d2/orthodichlorobenzene," as described above. An NMR spectral analysis (see above) of the inventive EPDMs displayed a peak area from 21.2-22.0 ppm greater than 3.5% of the total integral area from 19.5 to 22.0 ppm. Similar spectral analysis of the comparative EPDMs showed less than 3.5% of the total integral area from 19.5 to 22.0 ppm. Spectral data were referenced to the EEE backbone at 30 ppm. Peak responses in this region typically are related to differences in propylene tacticity (% mm) that have been incorporated into the EPDM. A similar analysis can be done for another type of ethylene/α-olefin/diene interpolymer.

EXPERIMENTAL

Materials used in this section are listed in Table 1.

TABLE 1

| Component | Chemical name | Characteristic | Supplier |
|---|---|---|---|
| NORDEL IP 4570* | EPDM | EPDM Polymer | Dow Chemical |
| NORDEL 3745** | EPDM | EPDM Polymer | Dow Chemical |
| NORDEL IP 4760*** | EPDM | EPDM Polymer | Dow Chemical |

TABLE 1-continued

| Component | Chemical name | Characteristic | Supplier |
|---|---|---|---|
| NORDEL IP 3640**** | EPDM | EPDM Polymer | Dow Chemical |
| EPDM 51***** | EPDM | EPDM Polymer | Dow Chemical |
| SP 5000 | Carbon Black | Carbon Black | Cabot |
| CB N990 | Carbon Black | Carbon Black | Cancarb |
| Silica VN3 | — | Silica | Evonik |
| SILQUEST* A-172NT | vinyl tris (2 methoxy-ethoxy) silane | Silane modifier | Momentive Performance Materials Inc. |
| SUNPAR 2280 | | Processing oil | SUNOCO |
| NAUGARD 445 | 4,4'-Bis (α, α-dimethylbenzyl) diphenylamine | Antioxidant | Addivant |
| MMBI | methylmercapto-benzimidazole | Antioxidant | Lanxess |
| TMQ | Polymerized 2,2,4-trimethyl-1,2-dihydroquinoline | Antioxidant | Lanxess |
| MgO | — | Filler | SCRC |
| AFLUX 42 | Fatty acid derivatives | Processing aid | Lanxess |
| PEG 8000 | Polyethylene glycols | Processing aid | SCRC |
| LUPEROX F40P | 1,3(4)-bis(tert-butylperoxy-isopropyl)benzene, bisperoxide | Peroxide | Arkema |
| LUPEROX 101 | 2,5-Dimethyl 2,5-di(tert-butylperoxy) hexane | Peroxide | Arkema |
| TiPP | Tri-isopropyl phosphate | Additive | SCRC |
| TCPP | Tris (chloroisopropyl) phosphate | Additive | SCRC |
| TEHP | Tri-2-ethylhexylphosphate | Additive | SCRC |
| TAIC | Triallyl isocyanurate | Coagent for peroxide | SCRC |

*Density (ASTM D792 = 0.86 g/cc, and a Mooney Viscosity (ML 1 + 4 at 125° C., ASTM D1646) = 70.
**Density (ASTM D792 = 0.88 g/cc, and a Mooney Viscosity (ML 1 + 4 at 125° C., ASTM D1646) = 45.
***Density (ASTM D792 = 0.88 g/cc, and a Mooney Viscosity (ML 1 + 4 at 125° C., ASTM D1646) = 60.
****Density (ASTM D792 = 0.86 g/cc, and a Mooney Viscosity (ML 1 + 4 at 125° C., ASTM D1646) = 40.
*****Density (ASTM D792 = 0.86 g/cc, and a Mooney Viscosity (with oil) (ML 1 + 4 at 125° C., ASTM D1646) = 55, Mw = 390,000 g/mol.

Continuous Polymerization of EPDM 51

The polymerization reaction was performed under steady state conditions, that is, constant reactant concentration and continual input of solvent, monomers, and catalyst, and constant withdrawal of unreacted monomers, solvent and polymer. The reactor system was cooled and pressurized to prevent formation of a vapor phase. Monomers: ethylene (GAS 74-85-1); propylene (GAS 115-07-1); 5-ethylidene-2-norbornene, ENB (GAS 16219-75-3).

The polymer composition was produced in a solution polymerization process using a continuous stir-tanked reactor followed by loop reactor. Ethylene was introduced in a mixture of a solvent of ISOPAR E (available from Exxon-Mobil), propylene was introduced and 5-ethylidene-2-norbornene (ENB) was introduced, each forming a reactor feed stream. Catalyst was fed to each the reactor separately, and activated in-situ using co-catalyst 1 and co-catalyst 2. The outlet of each reactor was consequently a mixture of polymer, solvent, and reduced levels of the initial monomers. The outlet of the first reactor was fed directly into the second reactor (unless otherwise sampled). The molecular weight of the polymer was controlled by adjusting each reactor's temperature, monomer conversion and/or the addition of a chain terminating agent such as hydrogen.

After polymerization, a small amount of water was introduced into the reactor exit stream as a catalyst kill, and the reactor exit stream was introduced into a flash vessel, in which the solids concentration was increased by at least 100 percent. A portion of the unreacted monomers, that is, ENB, ethylene, and propylene, and the unused diluent were then collected, and recycled back to the reactor feeds as appropriate. See also U.S. Pat. Nos. 5,977,251 and 6,545,088, and the references therein. Monomer feed rate and polymerization temperature and other conditions are listed in below in Table 2 and Table 3.

TABLE 2

Reaction Conditions

| | Reactor Temp. [deg C.] | Production Rate Split [%] | Pressure [psig] | Solvent/ Ethylene Feed Ratio [lb/lb] | Propylene/ Ethylene Feed Ratio [lb/lb] | ENB/ Ethylene Feed Ratio [lb/lb] |
|---|---|---|---|---|---|---|
| EPDM51 R1 (first reactor) | 117.0 | 50 | 752 | 14.4 | 1.54 | 0.22 |
| EPDM51 (second reactor) | 130.0 | 50 | 725 | 11.3 | 0.82 | 0.20 |

TABLE 3

Reaction Conditions Continued

| | | H2 Mol % | C2 Concen. [g/L] | Catalyst Efficiency [lb_poly/ lb_metal] *10E6 | Borate/Cat. Metal Ratio [mol/mol] | Aluminum/ Cat. Metal Ratio [mol/mol] |
|---|---|---|---|---|---|---|
| EPDM51 R1 (first reactor) | Catalyst-1 | 0.01 | 19.0 | 1.7 | 2.0 | 60.4 |
| EPDM51 (second reactor) | Catalyst-1 | 0.03 | 10.5 | 0.5 | 2.0 | 30.0 |

*Catalyst is: [[6',6'''-((2R,4S)-pentane-2,4-diylbis(oxy))bis(3-(3,6-di-tert-butyl-9H-carbazol-9-yl)-3'-fluoro-5-(2,4,4-trimethylpentan-2-yl)-[1,1'-biphenyl]-2-ol)]] (2-)]-zirconium dimethyl.
**Cocatalyst-1 was a mixture of methyldi(C14-18 alkyl)ammonium salts of tetrakis(pentafluorophenyl)borate, prepared by reaction of a long chain trialkylamine (ARMEEN M2HT, available from Akzo-Nobel, Inc.), HCl and Li[B(C6F5)4], substantially as disclosed in U.S. Pat. No. 5,919,988 (Ex. 2). Cocatalyst-1 was purchased from Boulder Scientific, and used without further purification.
***Cocatalyst-2 (modified methylalumoxane (MMAO)) was purchased from Akzo Nobel, and used without further purification.

A. Study 1 Formulations (Compositions)
Preparation of the Formulations (Compositions)

All the formulations (see Table 4) were mixed with a 2 L Banbury rubber internal mixer at rotor speed 35 rpm. Raw materials were loaded with approximately 70 vol % filling level in the chamber. A standard "up-side down" mixing procedure was used, with carbon black, silica, oil, and additive packages added first. The EPDM was added last in the mixer. The peroxide curatives (peroxide and coagent for peroxide) were added into the mixer, when the compound temperature reached 65° C. The compound was finally dropped at 95° C. Mixing was completed on a two roll mill at a roll temperature 75° C. A compound blanket was sheeted out to be used for further testing. Each compound sheet (uncured) had a thickness of about 3 mm.

TABLE 4

Formulations

|  | CE-1 | CE-2 | CE-3 | IE-1 | IE-2 | IE-3 |
|---|---|---|---|---|---|---|
| NORDEL IP 4570 | 100 | 100 | 100 | 100 | 100 | 100 |
| SP 5000 | 25 | 25 | 25 | 25 | 25 | 25 |
| CB N990 | 25 | 25 | 25 | 25 | 25 | 25 |
| Silica VN3 | 20 | 20 | 20 | 20 | 20 | 20 |
| SILQUEST A-172NT | 1.6 | 1.6 | 1.6 | 1.6 | 1.6 | 1.6 |
| SUNPAR 2280 | 25 | 25 | 25 | 25 | 25 | 25 |
| NAUGARD 445 | 1.5 | 1.5 | 1.5 | 1.5 | 1.5 | 1.5 |
| MMBI | 1 | 1 | 1 | 1 | 1 | 1 |
| TMQ | 1 | 1 | 1 | 1 | 1 | 1 |
| MgO | 10 | 10 | 10 | 10 | 10 | 10 |
| AFLUX 42 | 1 | 1 | 1 | 1 | 1 | 1 |
| PEG 8000 | 2 | 2 | 2 | 2 | 2 | 2 |
| LUPEROX F40P | 10 | 10 | 10 | 10 | 10 | 10 |
| TAIC | 0 | 2 | 0 | 0 | 0 | 0 |
| TEHP | 0 | 0 | 0 | 2 | 0 | 0 |
| TiPP | 0 | 0 | 0 | 0 | 2 | 0 |
| TCPP | 0 | 0 | 0.18 | 0 | 0 | 2 |
| Total parts | 223.1 | 225.1 | 223.28 | 225.1 | 225.1 | 225.1 |
| Rubber Content wt %* | 45% | 44% | 45% | 44% | 44% | 44% |
| Filler Content wt %* | 36% | 36% | 36% | 36% | 36% | 36% |
| Calculated Phosphorus Content wt %* | 0% | 0% | 0.008% | 0.063% | 0.123% | 0.084% |
| Measured Phosphorus Content wt %* |  |  |  | 0.075% |  | 0.051% |

*Each wt % based on the weight of the composition.

B. Curing Properties—Study 1
Moving Die Rheometer (MDR) Analysis

MDR cure properties of each formulation are measured in accordance to ASTM D-5289, using an Alpha Technologies MDR 2000. A 4.5 g sample was cut from the above uncured sheet, and put into the MDR holder. The MDR test was carried out at 180° C., over a period of 30 minutes, at an oscillation frequency of 100 CPM (1.67 Hz), and an oscillation angle of 0.5 degree (7% strain). The minimum torque (ML) and maximum torque (MH) measured by the MDR during the testing interval was reported in dNm. The difference between MH and ML is indicative of the extent of crosslinking, with the greater the difference reflecting a greater extent of crosslinking. The time it takes for torque to reach equilibrium is reported in minutes. The time required for the increase of 1 (ts1) or 2 (ts2) points from minimum torque is recorded in minutes. The ts1 and ts2 values are indicative of the time required for the crosslinking process to begin. A shorter time indicates a faster crosslinking rate. Curing properties are shown in Table 5.

TABLE 5

MDR Curing Properties

|  | CE-1 | CE-2 | CE-3 | IE-1 | IE-2 | IE-3 |
|---|---|---|---|---|---|---|
| MH (dNm) | 18.41 | 22.95 | 17.43 | 19.66 | 20.13 | 20.41 |
| ML (dNm) | 2.30 | 2.32 | 1.98 | 2.33 | 2.39 | 2.39 |
| MH-ML (dNm) | 16.11 | 20.63 | 15.45 | 17.33 | 17.74 | 18.02 |
| t95 (min) | 8.33 | 8.36 | 7.99 | 8.13 | 8.14 | 8.38 |
| ts1 (min) | 0.44 | 0.47 | 0.44 | 0.49 | 0.46 | 0.48 |
| ts2 (min) | 0.59 | 0.61 | 0.57 | 0.64 | 0.59 | 0.63 |

C. Preparation of Crosslinked Compositions—Study 1
Preparation of the Crosslinked Test Specimens The physical properties of the formulations were measured from vulcanized plaques, which were formed by curing samples of the above uncured sheet in a compression molder (Carver Model CMV100H-20-BPX). To vulcanize each sample, the sample was subject to a minimum compression pressure of 3.5 MPa (500 psi), at 180° C., for 12 minutes. The molded plaque was removed from the mold, and cooled to room temperature. Samples were conditioned for 24 hours, at room temperature, prior to testing.

Tensile Stress—Strain

Tensile Strength at Break (TB) and Elongation at Break (EB) were measured using test specimens, which were die cut, using a "dumbbell" shaped tensile die, having the dimensions described in ASTM D412. Three die cut specimens were cut from the compression molded plaques, as prepared above.

Hot Air Aging

For hot air aging, an accelerating test at 180° C. was conducted. The test specimens ("dumbbell" shaped test specimens) were aged in an air ventilated oven, at 180° C., for 120 hours. Then the specimens were taken out, and conditioned at room temperature for about 24 hours before testing. Tensile properties (Tensile Strength at Break (TB), Elongation at Break (EB) and Modulus) of the aged specimens were measured at room temperature, following the method ASTM D412.

The physical properties of the vulcanizates, formed from the comparative and inventive compositions, are reported as the average of three test samples. See Table 6.

TABLE 6

Hot Air Aging Performance at 180° C.

|  |  | CE-1 | CE-2 | CE-3 | IE-1 | IE-2 | IE-3 |
|---|---|---|---|---|---|---|---|
| Initial | TB (MPa) | 11.1 | 12.0 | 14.2 | 12.8 | 13.3 | 13.9 |
|  | EB (%) | 460.0 | 338.1 | 455 | 497.0 | 515.1 | 518.2 |
| 120 h 180° C. | TB (MPa) | 5.9 | 4.3 | 3.5 | 5.2 | 4.9 | 6.2 |
|  | EB (%) | 126.8 | 87.1 | 95.7 | 136.0 | 134.0 | 166.6 |
| EB retention 180° C. | 0 h | 100% | 100% | 100% | 100% | 100% | 100% |
|  | 120 h | 28% | 26% | 21% | 27% | 26% | 32% |

TB = Tensile Strength at Break
EB = Elongation at Break

In this study, the following results are noted.
(1) Without any additives (CE-1), crosslinking density (MH-ML) and initial Tensile Strength at Break are reduced;
(2) TAIC (CE-2) may improve the crosslinking density (MH-ML) and Tensile Strength at Break, but Elongation at Break will be reduced;
(3) When the phosphate loading is lower than 0.010 wt % (CE-3, 0.008 wt %), no improvement in heat resistance is observed (CE-3 vs CE-1 and CE-2);

(4) Phosphates (IE-1, IE-2, and IE-3) give better crosslinking density (MH-ML), as compared with CE-1, and better initial Tensile Strength at Break and Elongation at Break as compared with CE-2;
(5) After hot air aging at 180° C. for 120 hours, the phosphate containing formulations (IE-1, IE-2, and IE-3) provide a better (higher) Elongation at Break, as compared to CE-1 and CE-2;
(6) TCPP could also provide better elongation retention after 180° C. for 120 h hot air aging (IE-3 vs CE-1 and CE-2).

D. Study 2 Formulations (Compositions) and Aging Performance

This study examines a group of comparative and inventive formulations (see Table 7), which showed that the compositions containing TiPP and TCPP gave better Tensile Strength at Break, Elongation at Break, and maintained good heat resistance, as compared to with compositions containing TAIC. See above for sample preparations and test methods. These compositions contain fillers, including carbon black and MgO. Each wt % is based on the weight of the composition. The "hot air aging performance" is shown in Table 8.

TABLE 7

Formulations

|  | CE-4 | IE-4 | IE-5 |
|---|---|---|---|
| EPDM 51 | 85 | 85 | 85 |
| NORDEL 3745 (second ethylene/alpha-olefin interpolymer) | 52 | 52 | 52 |
| SP 5000 | 45 | 45 | 45 |
| CB N990 | 25 | 25 | 25 |
| NAUGARD 445 | 1.5 | 1.5 | 1.5 |
| MMBI | 1 | 1 | 1 |
| TMQ | 1 | 1 | 1 |
| MgO | 10 | 10 | 10 |
| AFLUX 42 | 1 | 1 | 1 |
| PEG 8000 | 2.5 | 2.5 | 2.5 |
| LUPEROX F40P | 10 | 10 | 10 |
| TAIC | 2 | | |
| TiPP | | 1.8 | |
| TCPP | | | 2.6 |
| Total parts | 236 | 235.8 | 236.6 |
| Rubber Content wt %* | 58% | 58% | 58% |
| Filler Content wt %* | 34% | 34% | 34% |
| Calculated Phosphorus Content wt %* | 0% | 0.105% | 0.104% |

*Each wt % based on the weight of the composition.

TABLE 8

Hot Air Aging Performance

|  |  | CE-4 | IE-4 | DE-5 |
|---|---|---|---|---|
| Initial | TB (MPa) | 11.7 | 12.9 | 13.4 |
|  | EB (%) | 289.3 | 450.5 | 449.1 |
| 120 h, 180° C. | TB (MPa) | 7.1 | 7.9 | 8.7 |
|  | EB (%) | 150.3 | 212.4 | 261.5 |
| EB retention, 180° C. | 0 h | 100% | 100% | 100% |
|  | 120 h | 52% | 47% | 58% |

In this study, the following results are noted.
(1) IE-4 and IE-5 give better initial Tensile Strength at Break and Elongation at Break, as compared to CE-4; (2) After hot air aging at 180° C. for 120 h, IE-4 and IE-5 provide excellent elongation; (3) Composition containing TCPP also provide a better elongation retention after 180° C. for 120 hours, hot air aging (IE-5 vs CE-4).

E. Study 3 Formulations (Compositions) and Aging Performance

This study showed the compositions containing TiPP or TCPP gave better Tensile Strength at Break, Elongation at Break, compared to a composition containing TAIC. Here, MgO was used as the filler. See above for sample preparations and test methods. See Tables 9 and 10. IE-6 and IE-7 give better initial and hot aged Tensile Strength at Break and Elongation at Break.

TABLE 9

Formulations

|  | CE-5 | IE-6 | IE-7 |
|---|---|---|---|
| NORDEL IP 4570 | 100 | 100 | 100 |
| SUNPAR 2280 | 10 | 10 | 10 |
| MgO | 10 | 10 | 10 |
| AFLUX 42 | 1 | 1 | 1 |
| PEG 8000 | 2 |  | 2 |
| LUPEROX F40P | 10 | 10 | 10 |
| NAUGARD 445 | 1.5 | 1.5 | 1.5 |
| MMBI | 1 | 1 | 1 |
| TMQ | 1 | 1 | 1 |
| TAIC | 2 |  |  |
| TiPP |  | 1.8 |  |
| TCPP |  |  | 2.3 |
| Total | 138.5 | 138.3 | 138.8 |
| Rubber Content wt %* | 72% | 72% | 72% |
| Filler Content wt %* | 7% | 7% | 7% |
| Calculated Phosphorus Content wt %* | 0% | 0.180% | 0.157% |

*Each wt % based on the weight of the composition.

TABLE 10

Hot Air Aging Performance

|  |  | CE-5 | IE-6 | DE-7 |
|---|---|---|---|---|
| 0 h, 180° C. | TB (MPa) | 1.25 | 1.30 | 1.36 |
|  | EB (%) | 170.6 | 281.3 | 293.1 |
| 72 h, 180° C. | TB (MPa) | 1.58 | 1.61 | 1.76 |
|  | EB (%) | 162.9 | 231.0 | 245.9 |

F. Study 4 Formulations (Compositions) and Aging Performance

This study examines a group of comparative and inventive examples, which show that the compositions containing the TiPP or TCPP gave better initial and aged Tensile Strength at Break and Elongation at Break, as compared with a composition containing TAIC. These compositions include carbon black as the filler. See Tables 11 and 12. IE-8 and IE-9 gave better initial and hot aged Tensile Strength at Break and Elongation at break compared to CE-6, when using carbon black only as the filler.

TABLE 11

Formulations

|  | CE-6 | IE-8 | IE-9 |
|---|---|---|---|
| NORDEL IP 4760 (2nd ethylene/alpha-olefin interpolymer) | 30 | 30 | 30 |
| NORDEL IP 3640 | 70 | 70 | 70 |
| SP5000 | 25 | 25 | 25 |
| N990 | 25 | 25 | 25 |

TABLE 11-continued

| Formulations | CE-6 | IE-8 | IE-9 |
|---|---|---|---|
| SUNPAR 2280 | 20 | 20 | 20 |
| TAIC | 2 | | |
| TiPP | | 2 | |
| TCPP | | | 2 |
| LUPEROX F40P | 8 | 8 | 8 |
| Total parts | 180 | 180 | 180 |
| Rubber Content wt %* | 56% | 56% | 56% |
| Filler Content wt %* | 28% | 28% | 28% |
| Calculated Phosphorus Content wt %* | 0% | 0.153% | 0.105% |

*Each wt % based on the weight of the composition.

TABLE 12

Hot Air Aging Performance

| | | CE-6 | IE-8 | IE-9 |
|---|---|---|---|---|
| Initial | TB (MPa) | 8.7 | 11.2 | 11.5 |
| | EB (%) | 224.2 | 331.2 | 356.1 |
| 72 h, 180° C. | TB (MPa) | 2.2 | 3.4 | 2.2 |
| | EB (%) | 61.0 | 119.7 | 87.4 |
| EB retention, 180° C. | 0 h | 100% | 100% | 100% |
| | 72 h | 27% | 36% | 25% |

G. Study 5 Formulations (Compositions) and Aging Performance

Some of the compositions shown in Table 13 showed signs of compound blooming after 12 hours, at room temperature. However, such blooming was not observed in the above inventive compositions.

TABLE 13

| Formulations | CE-7 | CE-8 | CE-9 | CE-10 | CE-11 | CE-12 | CE-13 | CE-14 | CE-15 |
|---|---|---|---|---|---|---|---|---|---|
| NORDEL IP 4760 | 100 | 100 | 100 | 100 | 100 | 100 | 100 | 100 | 100 |
| TAIC | | 2 | | | | | | | |
| TiPP | | | 0.2 | 0.5 | 1 | 2 | | | |
| TCPP | | | | | | | 1 | 2.5 | 4 |
| LUPEROX 101 | 2 | 2 | 2 | 2 | 2 | 2 | 2 | 2 | 2 |
| Total | 102 | 104 | 102.2 | 102.5 | 103 | 104 | 103 | 104.5 | 106 |
| Compound blooming* | No | No | Yes | Yes | Yes | Yes | Yes | Yes | Yes |
| Rubber Content wt %** | 98% | 96% | 98% | 98% | 97% | 96% | 97% | 96% | 94% |
| Filler Content wt %** | 0% | 0% | 0% | 0% | 0% | 0% | 0% | 0% | 0% |
| Calculated Phosphorus Content wt %** | 0% | 0% | 0.027% | 0.067% | 0.134% | 0.266% | 0.092% | 0.226% | 0.357% |

*Blooming after 12 h at room temperature storage.
**Each wt % based on the weight of the composition.

H. Determination of Phosphorus Content in Uncured Sample Sheet or Cured Sheet Sample Preparation The polymer specimen is cut into small pieces, with a diameter≤2 mm, or with the longest length≤3 mm, before $^{31}$P NMR analysis. Cryogenic grinding may be used as an alternative approach of cutting the polymer specimen. A stock solution triphenyl phosphate (TPP, Sigma-Aldrich, ≥99% purity) at 0.5 wt % is prepared in 1,1,2,2-tetrachloroethane-d$_2$ (TCE-d$_2$). TPP was used as the internal standard for the $^{31}$P spectrum chemical shift calibration and quantification. An accurate weight (0.250 g) of TPP and an accurate weight of TCE-d$_2$ were recorded. Next, 100 g of TPP stock solution was added to 0.400 g of polyolefin specimen in 10 mm NMR tube. It is necessary to record exact weights of all the materials (stock solution of TPP and polymer specimen). The headspace in the NMR tube was purged with N$_2$ for 5 minutes to remove oxygen. The NMR tube was tightly capped. The capped sample tube was set at room temperature overnight to swell polymer sample. The sample tube was swelled at 75° C. for 40 min and periodically vortexing and mixing with a Pasteur pipette to improve sample homogeneity and extraction efficiency.

The $^{31}$P NMR spectra was acquired using a 10 mm broad band observer (BBO) probe on the Bruker AVANCE 400 MHz spectrometer (75° C.) Each acquisition was performed using ZGIG pulse sequence for quantitative 31P NMR analysis, 512 scans, 108K data points, 90 degree pulse and 75 s relaxation delay.

All spectra were referenced to the internal reference (triphenyl phosphate) at −17.91 ppm. An overlay of $^{31}$P NMR spectra of TIPP, TCPP and TEHP was shown in FIG. 1. Relative moles of total phosphorus were measured by integrating the area under resonances shown in this FIGURE. The integral of TPP peak at peak maximum at −17.91 ppm was set to 11000. The area of the interest is defined as 31P signal appearing in a chemical shift ranging from 10 ppm to −12 ppm phosphorus element is calculated using the following Equation A:

$$\text{Phosphorus content} = Y \times Z \quad \text{(Eqn. A), where}$$

$$Y = \frac{\text{Intergrated peak area(s) from } 10.00 \ ppm \text{ to} - 12.00 \ ppm}{11000}, \text{ and}$$

$$Z = \frac{(\text{wt of } TPP \text{ stock solution, g}) \times (\text{wt fraction of } TPP \text{ stock solution}) \times 31 \times 100}{(\text{wt of polymer specimen, g}) \times 326.28},$$

where the weight fraction of TPP stock solution (wt fraction of TPP stock solution) is the ratio weight of TPP (g) divided by the total weight of TCE-$d_2$ (g) and TPP (g). See Table 14 for results for the noted compositions.

TABLE 14

|  | IE-1 | IE-3 |
| --- | --- | --- |
| Calculated Phosphate content before crosslinking | 0.063 wt % | 0.084 wt % |
| Measured Phosphate content after crosslinking | 0.062 wt % | 0.057 wt % |

What is claimed is:

1. A composition comprising the following components:
A) at least one ethylene/α-olefin/diene terpolymer;
B) a peroxide;
C) at least one filler comprising of carbon black and MgO in a weight ratio of carbon black to MgO from 4.0 to 8.0, and at least one filler selected from silica, ZnO, CaCO$_3$, Al(OH)$_3$, Mg(OH)$_2$, or a combination thereof,
D) a calculated P content from 0.010 wt % to 0.300 wt %, based on the weight of the composition, and wherein the calculated P content is the calculated content the phosphorus element present in one or more phosphate compounds selected from Structure 1 below:

O=P(OR1)(OR2)(OR3)  (Structure 1), wherein R1, R2 and R3 are each, independently, selected from i) a non-aromatic hydrocarbon or ii) a non-aromatic hydrocarbon comprising at least one heteroatom, excluding P wherein, for Structure 1, R1, R2 and R3 each, independently, do not contain a double bond.

2. The composition of claim 1, wherein the Structure 1 is selected from the following structures i through vii and ix through xiv,

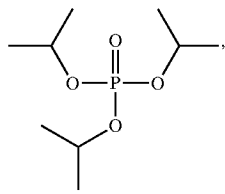
(i)

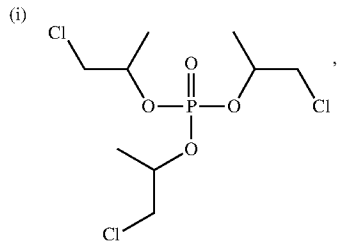
(ii)

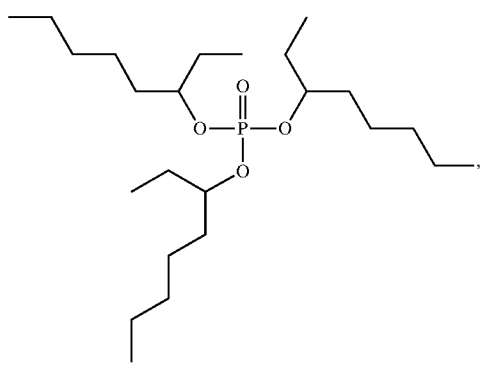
(iii)

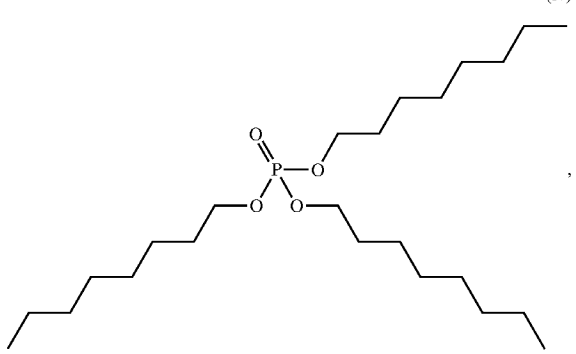
(iv)

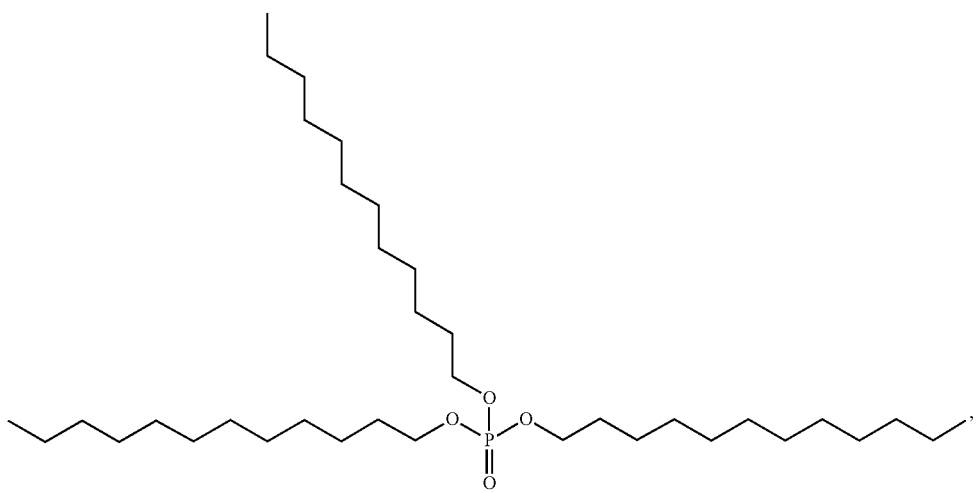
(v)
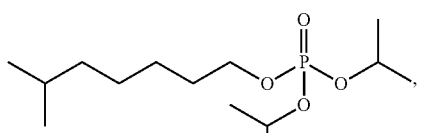
(vi)
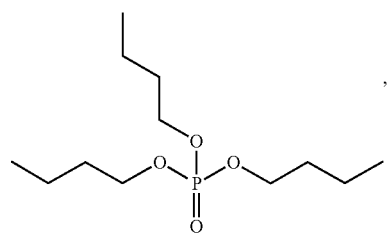
(vii)
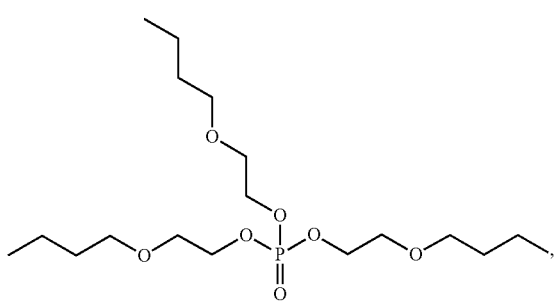
(ix)
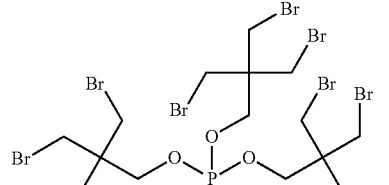
(x)
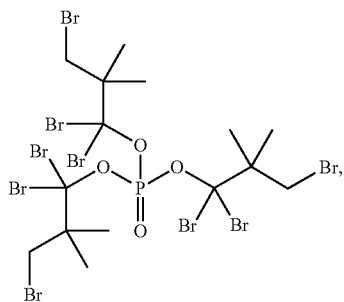
(xi)
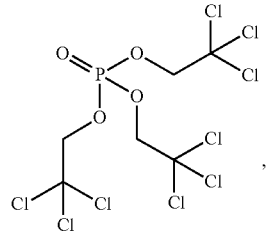
(xii)
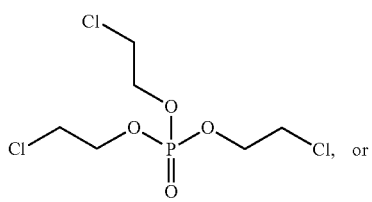
(xiii)
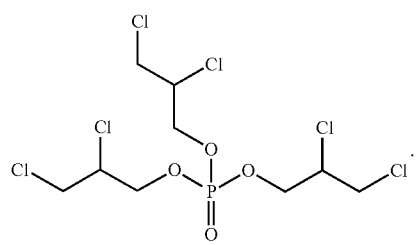
(xiv)

3. A crosslinked composition formed from the composition of claim 1.

4. The crosslinked composition of claim 3, and wherein the crosslinked composition has a measured P content from 0.010 wt % to 0.300 wt %, based on the weight of the crosslinked composition, and wherein the measured P content is the measured content the phosphorus element present in one or more phosphate compounds selected from Structure 1, as determined by 31P NMR.

5. An article comprising at least one component formed from the composition of claim 1.

* * * * *